United States Patent
Tseng et al.

(10) Patent No.: US 9,640,487 B2
(45) Date of Patent: May 2, 2017

(54) WAFER ALIGNMENT MARK SCHEME

(71) Applicant: TAIWAN SEMICONDUCTOR MANUFACTURING COMPANY, LTD., Hsinchu (TW)

(72) Inventors: Wei-Hsiang Tseng, Hsinchu (TW); Chao-Hsiung Wang, Hsin-chu (TW); Chin-Hsiang Lin, Hsinchu (TW); Heng-Hsin Liu, New Taipei (TW); Ho-Ping Chen, Jhubei (TW); Jui-Chun Peng, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/688,766

(22) Filed: Apr. 16, 2015

(65) Prior Publication Data

US 2015/0219448 A1    Aug. 6, 2015

Related U.S. Application Data

(60) Continuation-in-part of application No. 14/486,514, filed on Sep. 15, 2014, which is a division of
(Continued)

(51) Int. Cl.
*G01B 11/00*   (2006.01)
*H01L 23/544*   (2006.01)
(Continued)

(52) U.S. Cl.
CPC .......... *H01L 23/544* (2013.01); *G03F 9/7011* (2013.01); *G03F 9/7084* (2013.01);
(Continued)

(58) Field of Classification Search
CPC .......... G01B 11/27; G01B 11/14; G01B 11/00; G03B 27/52; H01L 23/544; H01L 21/76
See application file for complete search history.

(56) References Cited

U.S. PATENT DOCUMENTS

| 4,952,060 A | 8/1990 | Ina et al. |
| 5,601,957 A | 2/1997 | Mizutani et al. |

(Continued)

FOREIGN PATENT DOCUMENTS

| KR | 10-1999-004579 | 1/1999 |
| KR | 10-2004-0040967 | 5/2004 |

(Continued)

OTHER PUBLICATIONS

Office Action dated Jul. 25, 2014 from corresponding application No. TW 101141251.
(Continued)

*Primary Examiner* — Tarifur Chowdhury
*Assistant Examiner* — Jamil Ahmed
(74) *Attorney, Agent, or Firm* — Slater Matsil, LLP (57) ABSTRACT

A wafer alignment apparatus includes a light source, a light detection device, and a rotation device configured to rotate a first wafer and a second wafer. The light source is configured to provide a first light directed to the first wafer and a second light directed to the second wafer. The light detection device is configured to detect reflected light intensity from the first wafer to find a position of at least one wafer alignment mark of the first wafer and to detect reflected light intensity from the second wafer to find a position of at least one wafer alignment mark of the second wafer.

20 Claims, 6 Drawing Sheets

Related U.S. Application Data application No. 13/485,224, filed on May 31, 2012, now abandoned.

(60) Provisional application No. 61/616,975, filed on Mar. 28, 2012.

(51) Int. Cl.
*H01L 21/66* (2006.01)
*G03F 9/00* (2006.01)

(52) U.S. Cl.
CPC ...... *H01L 22/10* (2013.01); *H01L 2223/5442* (2013.01); *H01L 2223/54426* (2013.01); *H01L 2223/54453* (2013.01); *H01L 2924/0002* (2013.01)

(56) References Cited

U.S. PATENT DOCUMENTS

| | | | | | |
|---|---|---|---|---|---|
| 2001/0028456 | A1* | 10/2001 | Nishi | ............. | G03F 7/70733 356/400 |
| 2003/0081189 | A1* | 5/2003 | Minami | ............. | G03F 7/70258 355/55 |
| 2007/0002323 | A1* | 1/2007 | Fukui | ............. | G03F 9/7088 356/401 |
| 2007/0020871 | A1* | 1/2007 | Chen | ............. | H01L 21/681 438/401 |
| 2009/0146325 | A1* | 6/2009 | Liu | ............. | H01L 23/544 257/797 |
| 2011/0001974 | A1* | 1/2011 | Harada | ............. | G03F 1/14 356/401 |
| 2011/0317163 | A1* | 12/2011 | Lee | ............. | G03F 9/7046 356/401 |

FOREIGN PATENT DOCUMENTS

| | | |
|---|---|---|
| KR | 10-2007-0014585 | 2/2007 |
| TW | I332689 | 11/2010 |

OTHER PUBLICATIONS

Office Action dated Nov. 15, 2013 with English Translation from corresponding application No. KR 10-2012-0114626.

Notice of Allowance dated Sep. 29, 2014 from corresponding No. KR 10-2012-0114626.

\* cited by examiner

WAFER ALIGNMENT MARK SCHEME

PRIORITY CLAIM

This application is a continuation-in-part of U.S. application Ser. No. 14/486,514 which was filed on Sep. 15, 2014, the contents of which are incorporated by reference herein in their entirety.

TECHNICAL FIELD

The present disclosure relates generally to an integrated circuit and more particularly to a wafer alignment mark.

BACKGROUND

For an integrated circuit fabrication process, some wafers have a notch for wafer alignment. For such a wafer, the wafer is rotated 360° in some cases to find the wafer notch for alignment. However, the wafer notch may result in random solvent splash on the wafer during a wafer edge cleaning process, which is a defect source and can induce yield penalty. Also, such solvent splash can induce arcing effect during an etching process of the wafer.

BRIEF DESCRIPTION OF THE DRAWINGS

Reference is now made to the following descriptions taken in conjunction with the accompanying drawings, in which.

DETAILED DESCRIPTION

The making and using of various embodiments are discussed in detail below. It should be appreciated, however, that the present disclosure provides many applicable inventive concepts that can be embodied in a wide variety of specific contexts. The specific embodiments discussed are merely illustrative of specific ways to make and use, and do not limit the scope of the disclosure.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "below," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

Figure 1A:
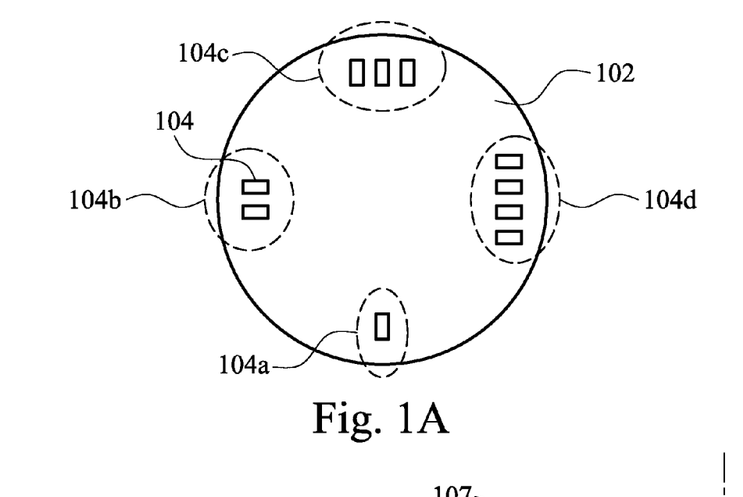
FIG. 1A is a schematic diagram of an exemplary wafer with wafer alignment marks according to some embodiments.

FIG. 1A is a schematic diagram of an exemplary wafer 102 with wafer alignment marks 104 according to some embodiments. The wafer 102 has wafer alignment marks 104 at a backside 103. There are four exemplary wafer alignment marks 104 centered at positions evenly distributed along the edge of the wafer 102 as shown in FIG. 1A: a first wafer alignment mark 104a having one recess (opening, hole, or cut), a second wafer alignment mark 104b having two recesses, a third wafer alignment mark 104c having three recesses, and a fourth wafer alignment mark 104d having four recesses. The wafer 102 comprises silicon or any other suitable material. The wafer alignment marks 104 are formed on the wafer's backside by laser or etching, for example.

The four wafer alignment marks 104a, 104b, 104c, and 104d are formed centered at 0°, 90°, 180°, and 270° respectively along the edge of the wafer 102. Therefore, by rotating the wafer 102 by 90°, one of the four wafer alignment marks will be detected to find the alignment position. If a different number of wafer alignment marks 104 are used, the positions of the wafer alignment marks 104 can be evenly distributed by dividing 360° by the number of the wafer alignment marks 104. For example, if there are three wafer alignment marks 104, they can be distributed at 0°, 120°, 240°. In this case, the wafer can be rotated by 120° to find one of the wafer alignment marks 104 to find the alignment position. In other embodiments, the wafer alignment marks 104 can be distributed unevenly depending on the applications.

The size of the wafer alignment marks 104 are from (1 mm×1 mm) to (5 mm×5 mm) in some embodiments. The wafer alignment marks 104 have a depth of 0.12 μm in one example. The shape of the wafer alignment marks 104 can be different shapes, such as a circle, triangle, square or any other polygon, for example.

Figure 1B:
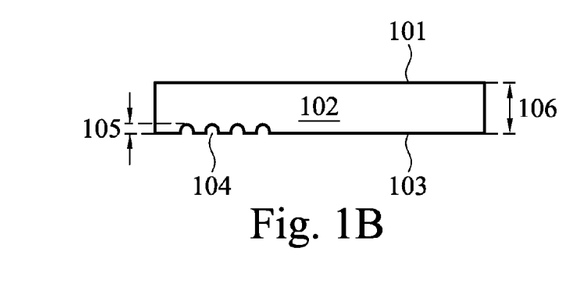
FIG. 1B is a cross-section view of an exemplary wafer with wafer alignment marks according to some embodiments.

FIG. 1B is a cross-section view of exemplary wafer 102 with wafer alignment marks 104 according to some embodiments. The wafer 102 has a front side 101 used as a main surface for integrated circuit formation and the backside 103. The wafer alignment marks 104 are formed on the backside 103 of the wafer 102. The wafer 102 has a thickness 106 ranging from 100 μm to 300 μm in some embodiments. The wafer alignment marks 104 (recesses) have a depth 105 ranging from 100 nm to 200 nm in some embodiments. If the depth 105 is less than 100 nm, the detection of the wafer alignment marks 104 may need higher sensitivity to recognize the difference in reflected light intensity due to the wafer alignment marks 104. If the depth 105 is greater than 200 nm, particles may remain in the wafer alignment marks 105.

Figure 1C:
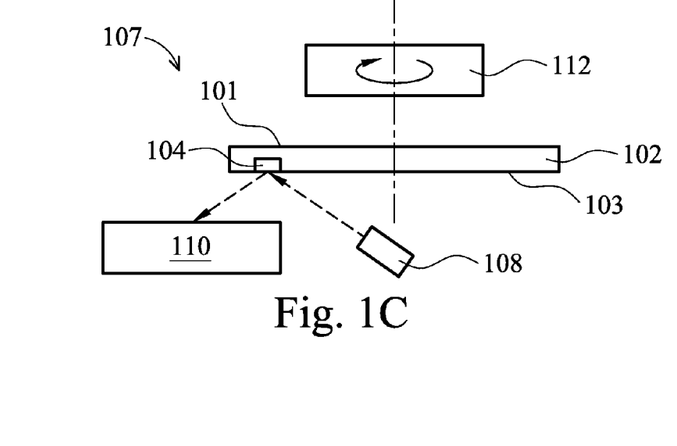
FIG. 1C is a schematic diagram of an exemplary wafer alignment mark detection setup according to some embodiments.

FIG. 1C is a schematic diagram of an exemplary wafer alignment mark detection setup 107 according to some embodiments. A light source 108 such as laser and a light detection device 110 such as charge-coupled device (CCD) sensor are located under the wafer 102. As the wafer 102 is rotated by a rotation device 112 for a specified angle, light transmitted from the light source 108 is directed to the wafer backside 103 and reflected to the light detection device 110. The light detection device 110 such as a CCD sensor collects the light intensity distribution to find the wafer alignment position. In some embodiments, the detected light intensity is reduced at the wafer alignment mark 104 positions to find the alignment positions.

By using the wafer alignment mark 104 formed on the backside 103 of the wafer 102, solvent splash impact is reduced during the wafer edge cleaning process. With four wafer alignment mark 104 evenly spaced as shown in FIG. 1A, the alignment mark search time (e.g., rotating the wafer 90°) is reduced 75% compared to finding a notch by rotating the wafer 360°. Therefore, the wafer process yield time is improved.

Figure 2A:
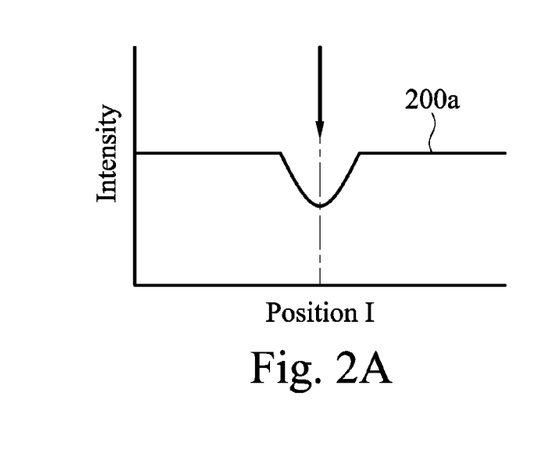
FIGS. 2A-2D are plots of detected light intensity versus wafer position for the exemplary wafer alignment marks in FIG. 1A according to some embodiments.

FIGS. 2A-2D are plots 200a-200d of detected light intensity versus wafer position for the exemplary wafer alignment marks in FIG. 1A according to some embodiments. In FIG. 2A, the (light) intensity plot 200a shows finding the position I of the first wafer alignment mark 104a in FIG. 1A with one recess (opening, hole, or cut). As the wafer 102 is rotated 90 degrees, the detected light intensity is reduced at position I due to the first wafer alignment mark 104a. Since the detected intensity is reduced one time, the position I is found as the first wafer alignment mark 104a. The position I can be used for the wafer alignment. In some embodiments, a computer, a processor, or a memory can be used to monitor the detected intensity or save the position for alignment.

Figure 2B:
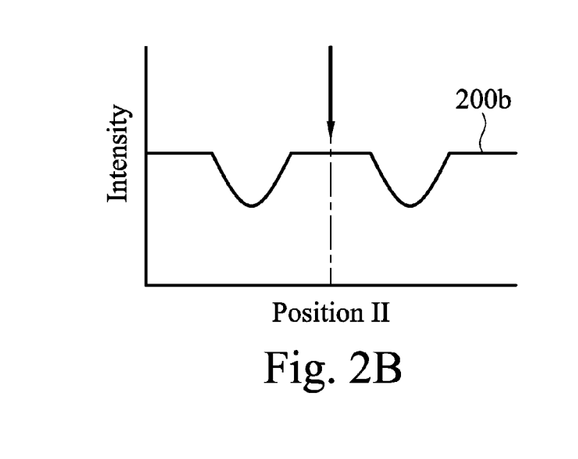

In FIG. 2B, the (light) intensity plot 200b shows finding the position II of the second wafer alignment mark 104b in FIG. 1A with two recesses. As the wafer 102 is rotated 90 degrees, the detected light intensity is reduced two times centered at the position II due to the second wafer alignment mark 104b. The position II is found as the second wafer alignment mark 104b. The position II can be used for the wafer alignment.

Figure 2C:
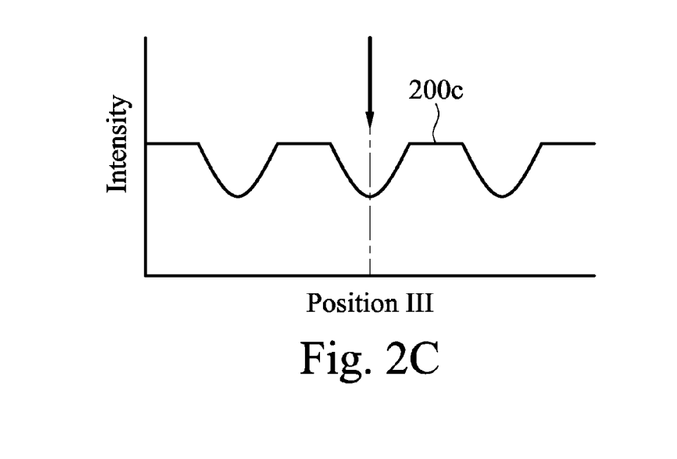

In FIG. 2C, the (light) intensity plot 200c shows finding the position III of the third wafer alignment mark 104c in FIG. 1A with three recesses. As the wafer 102 is rotated 90 degrees, the detected light intensity is reduced three times centered at the position III due to the third wafer alignment mark 104c. The position III is found as the third wafer alignment mark 104c. The position III can be used for the wafer alignment.

Figure 2D:
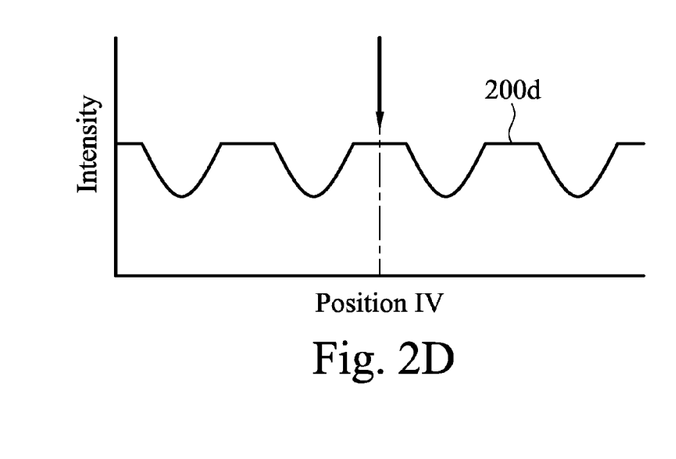

In FIG. 2D, the (light) intensity plot 200d shows finding the position IV of the fourth wafer alignment mark 104d in FIG. 1A with four recesses. As the wafer 102 is rotated 90 degrees, the detected light intensity is reduced four times centered at the position IV due to the fourth wafer alignment mark 104d. The position IV is found as the fourth wafer alignment mark 104d. The position IV can be used for the wafer alignment.

Even though the number of recesses is counted to find and identify wafer alignment marks 104 in the examples, different shapes or patterns comprising multiple small recesses can be used for the wafer alignment marks 104 with the light detection device 110 recognizing the shapes or patterns.

Figure 3:
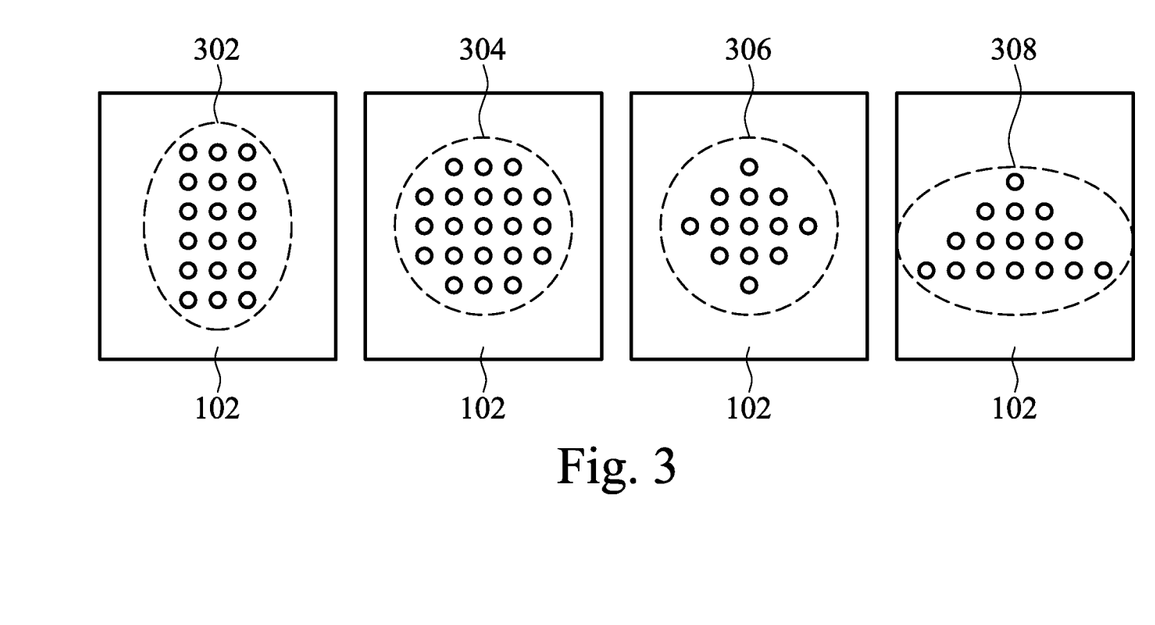
FIG. 3 is a schematic diagram of exemplary wafer alignment mark shapes according to some embodiments.

FIG. 3 is a schematic diagram of exemplary wafer alignment mark shapes according to some embodiments. FIG. 3 shows different wafer alignment mark shapes 302, 304, 306, and 308 comprising multiple small recesses or holes (dots). The light detection device 110 detects (identifies or recognizes) the shapes or patterns and find the alignment position in some embodiments. Any other shapes or patterns can be used for the wafer alignment marks 104 in FIG. 1A in other embodiments.

Figure 4:
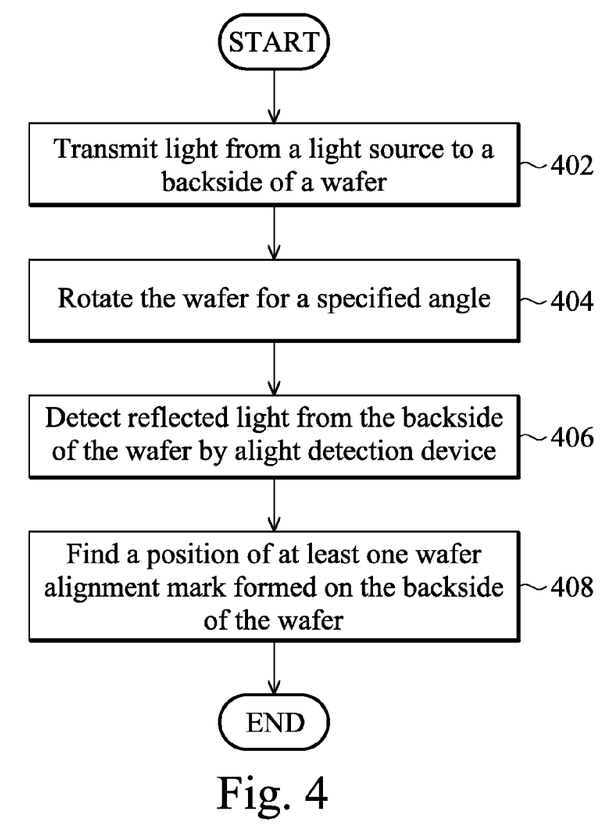
FIG. 4 is a flowchart of an exemplary method of wafer aligning using wafer alignment marks in FIG. 1A according to some embodiments.

FIG. 4 is a flowchart of an exemplary method of wafer alignment using wafer alignment marks 104 in FIG. 1A according to some embodiments. At step 402, light is transmitted from a light source to a backside of a wafer. At step 404, the wafer is rotated for a specified angle, e.g., 90°. The rotated angle is 360° divided by the number of wafer alignment marks in some embodiments. In some embodiments, if the distribution of alignments marks is uneven, the specified angle is different than 360° divided by the number of wafer alignment marks. At step 406, reflected light from the backside of the wafer is detected by a light detection device. At step 408, a position of at least one wafer alignment mark that is formed on the backside of the wafer is found.

According to some embodiments, a wafer alignment apparatus includes a light source, a light detection device, and a rotation device configured to rotate a wafer. The light source is configured to provide light directed to a backside of the wafer. The light detection device is configured to detect reflected light intensity from the backside of the wafer to find a position of at least one wafer alignment mark formed on the backside of the wafer.

According to some embodiments, a method includes transmitting light from a light source to a backside of a wafer. The wafer is rotated for a specified angle. Reflected light from the backside of the wafer is detected by a light detection device. A position of at least one wafer alignment mark formed on the backside of the wafer is found.

According to some embodiments, a wafer includes a front side used as a main surface for integrated circuit formation, a backside, and at least one wafer alignment mark formed on the backside. The at least one wafer alignment mark is configured to change a light intensity reflected from the backside in order to find a position of the at least one wafer alignment mark.

According to some embodiments, alignment marks are formed on either side of the wafer.

Figure 5:
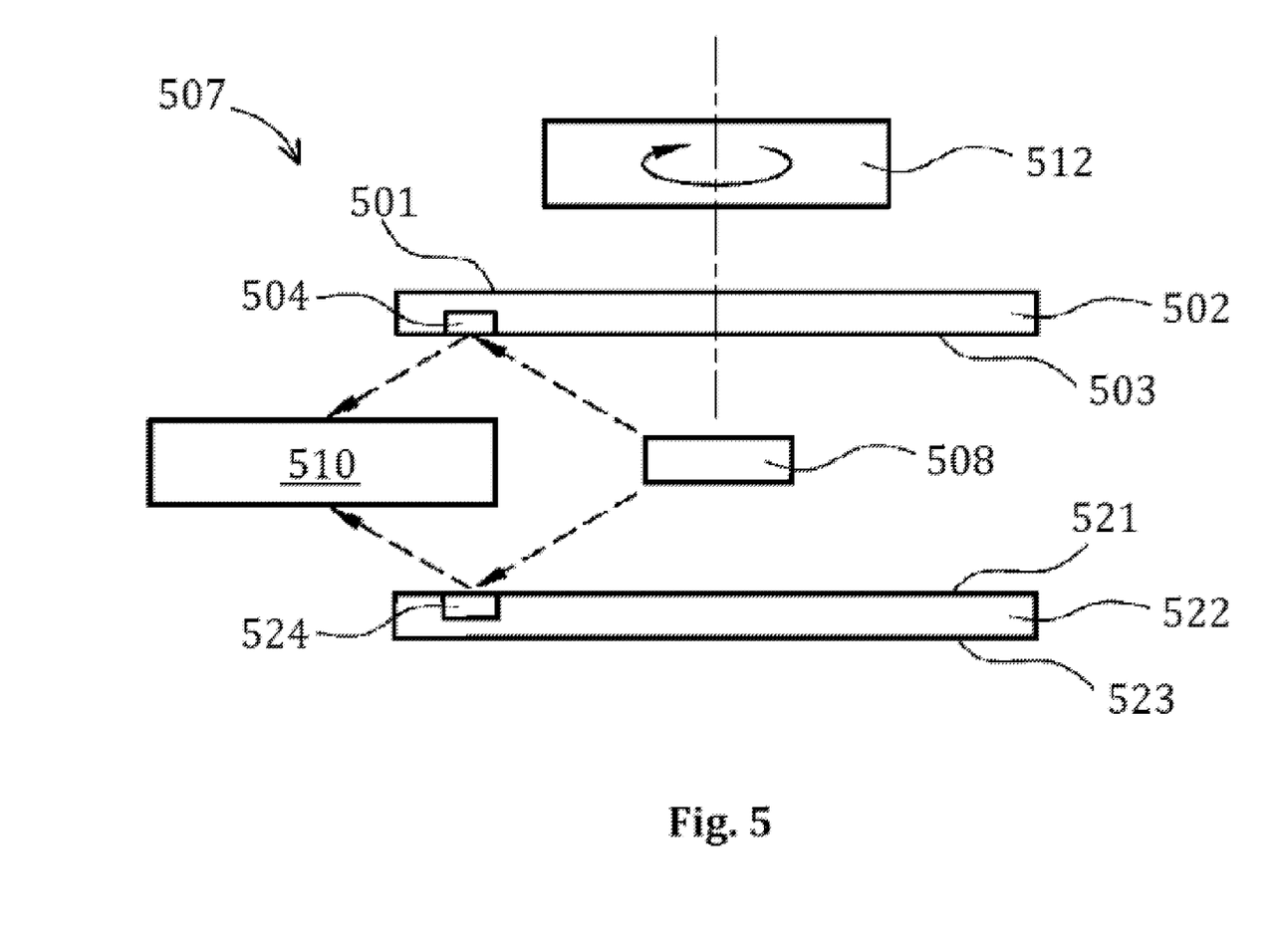
FIG. 5 is a schematic diagram of an exemplary wafer alignment mark detection setup according to some embodiments.

FIG. 5 is a schematic diagram of an exemplary wafer alignment mark detection setup 507 according to some embodiments. A light source 508 such as laser and a light detection device 510 such as charge-coupled device (CCD) sensor are located between a first wafer 502 and a second wafer 522. First wafer 502 is similar to first wafer 102 (FIG. 1) with the reference numerals increased by 400. Second wafer 522 is similar to first wafer 102 with the reference numerals increased by 420. The first wafer 502 and the second wafer 522 have alignment marks 504 and 524 formed thereon. Wafer alignment marks 504 are formed on a backside 503 of first wafer 502. Wafer alignment marks 524 are formed on a front side 521 of second wafer 522. In some embodiments, the first wafer 502 and the second wafer 522 are identical with respect to a number or arrangement of alignment marks formed thereon. In some embodiments, the first wafer 502 and the second wafer 522 are different with respect to the number or the arrangement of alignment marks formed thereon. In use, as the first wafer 502 is rotated by a rotation device 512 for a specified angle, light transmitted from the light source 508 is directed to the first wafer backside 503 and reflected to the light detection device 510. Similarly, as the second wafer 552 is rotated by the rotation device 512 for a specified angle, light transmitted from the light source 508 is directed to the second wafer front side 521 and reflected to the light detection device 510. The light detection device 510 collects the light intensity distribution to find the wafer alignment position. In some embodiments, the detected light intensity is reduced at the wafer alignment mark 504 position and the wafer alignment mark 524 position to find alignment positions that correspond to the wafer alignment mark 504 and the wafer alignment mark 524.

Figure 6:
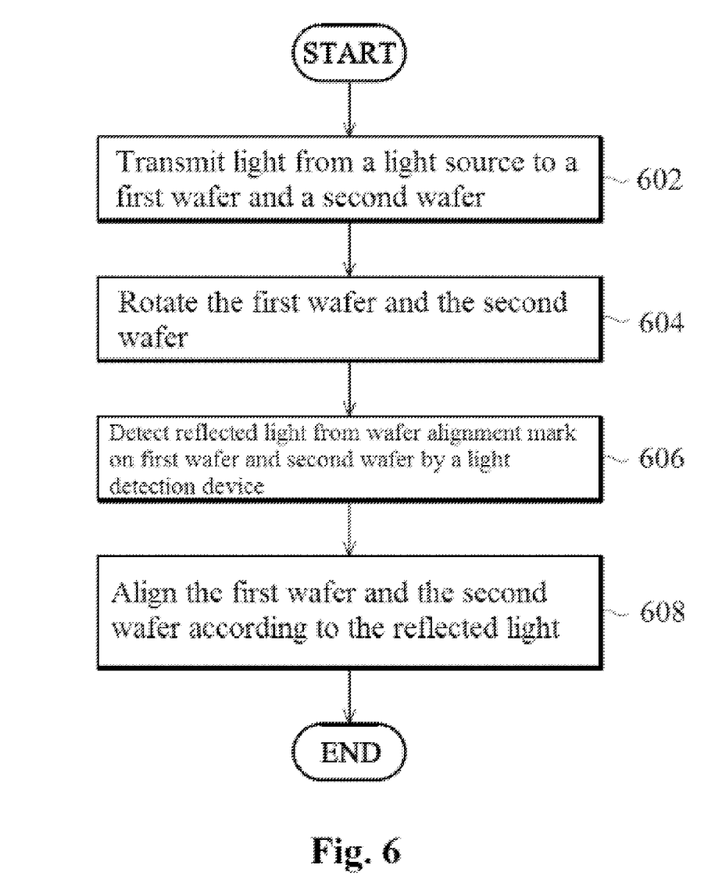
FIG. 6 is a flowchart of an exemplary method of wafer aligning using wafer alignment marks in FIG. 5 according to some embodiments.

FIG. 6 is a flowchart of an exemplary method of wafer alignment using wafer alignment marks 504 and 524 in FIG. 5 according to some embodiments. At step 602, light is transmitted from a light source to a first wafer and a second wafer. In one embodiment, light is transmitted from the light source to a backside of the first wafer and to a front side of the second wafer. In other embodiments, the light may be transmitted to either side of the wafer. At step 604, the first and the second wafer are rotated for a specified angle, e.g., 90°. The rotated angle is 360° divided by the number of wafer alignment marks in some embodiments. In some embodiments, if the distribution of alignments marks is uneven, the specified angle is different than 360° divided by the number of wafer alignment marks. The first wafer and the second wafer may be rotated for the identical angle in some embodiments and for different angles in other embodiments. At step 606, reflected light from the backside of the first wafer and the front side of the second wafer is detected by a light detection device. At step 608, a position of the wafer alignment mark of the first wafer and a position of the wafer alignment mark of the second wafer are found in order to align the first wafer and the second wafer according to the reflected light. In some embodiments, the first wafer and the second wafer is selectively rotated based on the number of the alignment marks formed thereon.

An aspect of this description relates to an wafer alignment apparatus. The apparatus comprises a light source, a light detection device, and a rotation device configured to rotate a first wafer and a second wafer. The light source is configured to provide a first light directed to the first wafer and a second light directed to the second wafer. The light detection device is configured to detect reflected light intensity from the first wafer to find a position of at least one wafer alignment mark of the first wafer and to detect reflected light intensity from the second wafer to find a position of at least one wafer alignment mark of the second wafer.

Another aspect of this description relates to a method comprising transmitting light from a light source to a first wafer and a second wafer. The method also comprises rotating the first wafer and the second wafer. The method further comprises detecting reflected light from at least one wafer alignment mark formed on the first wafer and at least one wafer alignment mark formed on the second wafer by a light detection device. The method additionally comprises aligning the first wafer and the second wafer according to the reflected light.

A further aspect of this description relates to a method comprising transmitting light from a light source to a first wafer and a second wafer. The method also comprises detecting reflected light from multiple wafer alignment marks formed on the first wafer and multiple wafer alignment marks formed on the second wafer by a light detection device. The method further comprises selectively rotating the first wafer and the second wafer for a specified angle depending on a number of the wafer alignment marks. The method additionally comprises finding a position of at least one wafer alignment mark of the wafer alignment marks of the first wafer and a position of at least one wafer alignment mark of the wafer alignment marks of the second wafer.

A skilled person in the art will appreciate that there can be many embodiment variations of this disclosure. Although the embodiments and their features have been described in detail, it should be understood that various changes, substitutions and alterations can be made herein without departing from the spirit and scope of the embodiments. Moreover, the scope of the present application is not intended to be limited to the particular embodiments of the process, machine, manufacture, and composition of matter, means, methods and steps described in the specification. As one of ordinary skill in the art will readily appreciate from the disclosed embodiments, processes, machines, manufacture, compositions of matter, means, methods, or steps, presently existing or later to be developed, that perform substantially the same function or achieve substantially the same result as the corresponding embodiments described herein may be utilized according to the present disclosure.

For example, in other embodiments, the wafer alignment mark detection setup may be configured to align multiple wafers. In yet other embodiments, the wafer alignment mark detection setup may be configured to align die-to-wafer for 3D integrated circuit stacking.

The above method embodiment shows exemplary steps, but they are not necessarily required to be performed in the order shown. Steps may be added, replaced, changed order, and/or eliminated as appropriate, in accordance with the spirit and scope of embodiment of the disclosure. Embodiments that combine different claims and/or different embodiments are within the scope of the disclosure and will be apparent to those skilled in the art after reviewing this disclosure.

What is claimed is:

1. A wafer alignment apparatus, comprising:
a light source;
a light detection device; and
a rotation device configured to rotate a first wafer and a second wafer,
wherein the light source is disposed between the first wafer and the second wafer and configured to provide a first light directed to the first wafer and a second light directed to the second wafer, wherein the first light is directed in a different direction than the second light, wherein the light detection device is configured to detect a first reflected light intensity from the first wafer to find a position of at least one first wafer alignment mark of a plurality of first wafer alignment marks in a backside surface of the first wafer and to detect a second reflected light intensity from the second wafer to find a position of at least one second wafer alignment mark of a plurality of second wafer alignment marks in a frontside surface of the second wafer, wherein the first reflected light intensity from each first wafer alignment mark of the plurality of first wafer alignment marks is identifiably different, wherein the second reflected light intensity from each second wafer alignment mark of the plurality of second wafer alignment marks is identifiably different, the backside surface of the first wafer facing the frontside surface of the second wafer, the frontside surface of second wafer being configured for integrated circuit structures.

2. The wafer alignment apparatus of claim 1, wherein the first wafer and the second wafer are selectively rotated for a specified angle depending on a number of the at least one wafer alignment mark of the first wafer or the at least one wafer alignment mark of the second wafer.

3. The wafer alignment apparatus of claim 2, wherein the specified angle is given as 360° divided by the number of the at least one wafer alignment mark of the first wafer or the at least one wafer alignment mark of the second wafer.

4. The wafer alignment apparatus of claim 1, wherein the position of the at least one wafer alignment mark of the first wafer or the at least one wafer alignment mark of the second wafer is found by recognizing a reduced light intensity detected by the light detection device.

5. The wafer alignment apparatus of claim 1, wherein the at least one wafer alignment mark of the first wafer or the at least one wafer alignment mark of the second wafer includes at least one recess and a number of the at least one recess is from one to a number corresponding to a position number associated with the at least one wafer alignment mark of the first wafer or the at least one wafer alignment mark of the second wafer.

6. The wafer alignment apparatus of claim 5, wherein the at least one recess has a depth ranging from 100 nm to 200 nm.

7. The wafer alignment apparatus of claim 1, wherein the at least one wafer alignment mark of the first wafer is one of a plurality of wafer alignment marks of the first wafer, the wafer alignment marks of the plurality of wafer alignment marks of the first wafer are separated by a plurality of angles, and at least two of the angles of the plurality of angles are equal.

8. A method, comprising:
transmitting a first light from a light source at an upward angle to a backside surface of a first wafer and transmitting a second light from the light source at a downward angle to a frontside surface of a second wafer, the first wafer and the second wafer each comprising a backside surface and a frontside surface opposite of the backside surface, the frontside surfaces being configured for integrated circuit structures;
rotating the first wafer and the second wafer;
detecting first reflected light from at least one alignment mark of a plurality of first wafer alignment marks formed on the backside of the first wafer by a light detection device and detecting a second reflected light from at least one alignment mark of a plurality of second wafer alignment marks formed on the frontside of the second wafer by the light detection device, wherein first reflected light from a first alignment mark of the plurality of first wafer alignment marks is identifiably different from first reflected light from a second alignment mark of the plurality of first wafer alignment marks, wherein second reflected light from a first alignment mark of the plurality of second wafer alignment marks is identifiably different from second reflected light from a second alignment mark of the plurality of second wafer alignment marks; and
aligning the first wafer and the second wafer according to the reflected first light and the reflected second light.

9. The method of claim 8, wherein the step of aligning comprises:
selectively rotating the first wafer and the second wafer for a specified angle depending on a number of the at least one wafer alignment mark of the first wafer or the at least one wafer alignment mark of the second wafer; and
finding a position of the at least one wafer alignment mark of the first wafer and a position of the at least one wafer alignment mark of the second wafer.

10. The method of claim 9, wherein the specified angle is given as 360° divided by the number of the at least one wafer alignment mark of the first wafer or the at least one wafer alignment mark of the second wafer.

11. The method of claim 9, wherein finding the position of the at least one wafer alignment mark of the first wafer or the at least one wafer alignment mark of the second wafer comprises recognizing a reduced light intensity detected by the light detection device.

12. The method of claim 8, wherein the at least one wafer alignment mark of the first wafer or the at least one wafer alignment mark of the second wafer includes at least one recess and a number of the at least one recess is from one to a number corresponding to a position number associated with the at least one wafer alignment mark of the first wafer or the at least one wafer alignment mark of the second wafer.

13. The method of claim 8, wherein the at least one recess has a depth ranging from 100 nm to 200 nm.

14. The method of claim 8, wherein the at least one wafer alignment mark of the first wafer is one of a plurality of wafer alignment marks of the first wafer, the wafer alignment marks of the plurality of wafer alignment marks of the first wafer are separated by a plurality of angles, and at least two of the angles of the plurality of angles are equal.

15. A method, comprising:
transmitting light from a light source to a backside surface of a first wafer and a frontside surface of a second wafer;
detecting, by a light detection device, first reflected light from a plurality of first wafer alignment marks formed on the backside surface of the first wafer, wherein the reflected light from each first wafer alignment mark of the plurality of first wafer alignment marks is identifiably different;
detecting, by the light detection device, second reflected light from a plurality of second wafer alignment marks formed on the frontside surface of the second wafer, wherein the reflected light from each second wafer alignment mark of the plurality of second wafer alignment marks is identifiably different;
selectively rotating the first wafer and the second wafer for a specified angle depending on a number of the first wafer alignment marks in the plurality of first wafer alignment marks and a number of the second wafer alignment marks in the plurality of second wafer alignment marks, respectively; and
finding a position of at least one first wafer alignment mark of the plurality of first wafer alignment marks of the first wafer and a position of at least one second wafer alignment mark of the plurality of second wafer alignment marks of the second wafer.

16. The method of claim 15, wherein the specified angle is given as 360° divided by the number of the first wafer alignment marks in the plurality of first wafer alignment marks of the first wafer or the number of second wafer alignment marks in the plurality of second wafer alignment marks of the second wafer.

17. The method of claim 15, wherein each first wafer alignment mark of the plurality of first wafer alignment marks of the first wafer or each second wafer alignment mark of the plurality of second wafer alignment marks of the second wafer includes at least one recess, wherein a number of the at least one recess is from one to a number corresponding to a position number associated with each first wafer alignment mark of the plurality of first wafer alignment marks of the first wafer or each second wafer alignment mark of the plurality of second wafer alignment marks of the second wafer.

18. The method of claim 17, wherein the at least one recess has a depth ranging from 100 nm to 200 nm.

19. The method of claim 15, wherein the first wafer alignment marks of the first wafer are separated by a plurality of angles and at least two of the angles of the plurality of angles are equal.

20. The method of claim 15, wherein the first wafer alignment marks of the first wafer are evenly distributed along an edge of the first wafer and the second wafer alignment marks of the second wafer are evenly distributed along an edge of the second wafer.

* * * * *